US012191813B2

(12) United States Patent
Jameson

(10) Patent No.: US 12,191,813 B2
(45) Date of Patent: Jan. 7, 2025

(54) COMPACT SINGLE STAGE WIDEBAND POWER AMPLIFIER

(71) Applicant: RAFAEL ADVANCED DEFENSE SYSTEMS LTD., Haifa (IL)

(72) Inventor: Samuel Jameson, Binyamina (IL)

(73) Assignee: Rafael Advanced Defense Systems Ltd., Haifa (IL)

( * ) Notice: Subject to any disclaimer, the term of this patent is extended or adjusted under 35 U.S.C. 154(b) by 140 days.

(21) Appl. No.: 17/767,870

(22) PCT Filed: Oct. 29, 2020

(86) PCT No.: PCT/IL2020/051126
§ 371 (c)(1),
(2) Date: Apr. 8, 2022

(87) PCT Pub. No.: WO2021/084536
PCT Pub. Date: May 6, 2021

(65) Prior Publication Data
US 2023/0387857 A1 Nov. 30, 2023

(30) Foreign Application Priority Data
Oct. 31, 2019 (IL) .......................................... 270376

(51) Int. Cl.
*H03F 1/02* (2006.01)
*H03F 1/56* (2006.01)
*H03F 3/21* (2006.01)

(52) U.S. Cl.
CPC ........... *H03F 1/0205* (2013.01); *H03F 1/565* (2013.01); *H03F 3/21* (2013.01); *H03F 2200/222* (2013.01); *H03F 2200/387* (2013.01)

(58) Field of Classification Search
CPC .......... H03F 1/0205; H03F 1/565; H03F 3/21; H03F 2200/222; H03F 2200/387;
(Continued)

(56) References Cited

U.S. PATENT DOCUMENTS 7,969,246 B1 * 6/2011 An ...................... H03F 3/45179
330/311
2012/0286874 A1 11/2012 Kim et al.

FOREIGN PATENT DOCUMENTS

CN 203632620 U 6/2014
CN 104065346 A 9/2014
(Continued)

OTHER PUBLICATIONS

Extended European Search Report, European Patent Office Application No. 20882818.6, Nov. 17, 2022, 10 pages.
(Continued)

*Primary Examiner* — Andrea Lindgren Baltzell
*Assistant Examiner* — Jose E Pinero
(74) *Attorney, Agent, or Firm* — Fenwick & West LLP; Daniel R. Brownstone

(57) ABSTRACT

A power amplifier with improved stability, gain, flatness and return loss and reduced the size, which comprises a two-stage power amplifier in balanced cascode topology that consists of a first common-source stage feeding into a first common-gate stage; a second common-source stage feeding into a second common-gate stage; an input matching network for matching the input impedance of the a two-stage power amplifier to a desired signal source impedance; an output matching network for matching the output impedance of the a two-stage power amplifier to a desired load; a first positive feedback path between the gate of the first common-source stage and the drain of the second common-gate (CG) stage and a second positive feedback path between the gate of the second common-source stage and the drain of the first common-gate (CG) stage; a first negative feedback path between the drain of the first common-gate (CG) stage and the gate of the first common-source stage and a second negative feedback path between the drain of the second common-gate (CG) stage and the gate of the second com- (Continued)

mon-source stage; a first inter-stage matching network between the first common-source (CS) stage and the first common-gate (CG) stage; and a second inter-stage matching network between the second common-source (CS) stage and the second common-gate (CG) stage.

16 Claims, 6 Drawing Sheets

(58) Field of Classification Search
CPC .............. H03F 2200/318; H03F 1/347; H03F 2200/451; H03F 2200/534; H03F 2200/537; H03F 2200/541; H03F 2203/45318; H03F 2203/45394; H03F 2203/45512; H03F 2203/45526; H03F 3/195; H03F 3/245; H03F 3/265; H03F 3/45179; H03F 3/68; H03F 3/45475
USPC ......................................................... 330/291
See application file for complete search history.

(56) References Cited

FOREIGN PATENT DOCUMENTS

| | | |
|---|---|---|
| CN | 106603022 A | 4/2017 |
| CN | 106849876 A | 6/2017 |
| KR | 20100120839 A | 11/2010 |

OTHER PUBLICATIONS

Jiang, C. et al., "A 24-28 GHz high-stability CMOS power amplifier using common-gate-shorting (CGS) technique with 17.5 dBm $P_{sat}$ and 16.3% PAE for 5G millimeter-wave applications", *Analog Integrated Circuits and Signal Processing*, Springer New York LLC, US, vol. 98, No. 1, Oct. 15, 2018 (Oct. 15, 2018), pp. 193-200, XP036679525, ISSN: 0925-1030, DOI: 10.1007S10470-018-1350-Y [retrieved on Oct. 15, 2018].

Kim, H. et al., "A fully integrated CMOS RF power amplifier with tunable matching network for GSM/EDGE dual-mode application", Microwave Symposium Digest (MTT), 2010 IEEE MTT-S International, IEEE, Piscataway, NJ, USA, May 23, 2010 (May 23, 2010), pp. 800-803, P031714237, ISBN: 978-1-4244-6056-4.

Huang, P.-C. et al., "A 22-dBm 24-GHz Power Amplifier Using 0.18-m. CMOS Technology" Proc. IEEE MTT-S Int. Microw. Symp. Dig., May 2010, pp. 248-251.

Khazraee, M. et al., "Moonwalk: NRE Optimization in ASIC Clouds, or Accelerators Will Use Old Silicon", Asplos 2017, pp. 511-526.

Kuo, C. W. et al. "An 18 to 33 GHZ Fully-Integrated Darlington Power Amplifier with Guanella-Type Transmission-Line Transformers in 0.18 μm CMOS Technology" IEEE Microwave and Wireless Components Letters, Dec. 2013, pp. 668-670, vol. 23 No. 12.

Kuo, C.-C. et al. "A K-band Compact Fully Integrated Transformer Power Amplifier in 0.18-μm CMOS" Asia-Pacific Microwave Conference Proceedings Dig., Nov. 2013, pp. 597-599.

Lin, J.-L. et al., "A K-band Transformer Based Power Amplifier with 24.4-dBm Output Power and 28% PAE in 90-nm CMOS Technology" IEEE MTT-S Int. Microw. Symp. Dig., Jun. 2017, pp. 31-34.

Mesri, A. et al., "High Gain Two-Stage Amplified with Positive Capacitive Feedback Compensation" IET Circuits, Devices & Systems, 2015, pp. 181-190, vol. 9, No. 3.

PCT International Search Report and Written Opinion, PCT Application No. PCT/IL2020/051126, Jan. 20, 2021, 8 pages.

European Patent Office, Office Action, EP Patent Application No. 20882818.6, Sep. 27, 2024, nine pages.

Fang, K. et al., "Efficient Linear Millimeter-Wave Distributed Transceivers in CMOS SOI," IEEE Transactions on Microwave Theory and Techniques, vol. 67, No. 1, Jan. 2019, pp. 295-307.

Jameson, S. et al., "A 18-24 GHz Compact Single Stage Amplifier with 13±0.5 dB gain, OP3dB of +19 dBm and 19% PAE for Radar Applications in Tower 180nm CMOS," 2019 IEEE International Conference on Microwaves, Antennas, Communications and Electronics Systems (COMCAS), Nov. 4, 2019, pp. 1-5.

\* cited by examiner

COMPACT SINGLE STAGE WIDEBAND POWER AMPLIFIER

FIELD OF THE INVENTION

The present invention relates to the field of power amplifiers. More particularly, the invention relates to an improved compact, single stage wideband power amplifier with stable high gain over wide frequency band with excellent flatness and return loss.

BACKGROUND OF THE INVENTION

Phased-array systems are widely used in many fields, including civil and military applications. Even though GaAs and GaN largely outperform silicon technology in terms of power and noise figure, CMOS still competes with its integration, scaling and compact properties. When taking into account large phased-array systems built out from hundreds to thousands of Tx (transmitter)/Rx (receiver) channels, CMOS demonstrates by far a superiority of reliability, scalability and price reduction.

During the last years, 5G systems have been emerged, widely pushing the state-of-the-art at Q/Ka-band integrated circuits with the use of innovative topologies and high-end process such as 65 nm, 45 nm SOI, 28 nm, 16 nm nodes. These processes demonstrate a unity gain cutoff frequency $f_T$ above 250-300 GHz and largely outmatch older processes (180 nm, 130 nm, 90 nm) in terms of scalability and noise figure performances.

In radar applications, heat dissipation is one of the main problems in terms of performances. The $1/f_T$ behavior of the noise figure allows to compensate for the power reduction while decreasing the technology node dimension. Therefore, decreasing the node is very attractive in terms of power management, allowing reducing the overall system heat while maintaining radar range performances thanks to the reduced noise figure. Price reduction of CMOS process scaling is often represented from a digital point of view with a criterion of $/transistor typically for S/D-RAM and NAND [1]. When shifting the criterion of NRE and RE in terms of $/channel in phased-array systems, scaling up the technology reaches very fast a cost effective limit. As shown in [1], mask cost factor from 180 nm to 28 and 16 nm are respectively around ½0 and ⅕0 while wafer cost factor are around ⅙ and ⅑ respectively. When taking into account the number of operations required as the process increases and its reliability, old process present currently cost advantages for phased-array applications. While 5G telecommunication industry targets very large volume of phased-array per year, many other industries cannot allow such R&D development cost and produce only few thousands of phased-array systems per year, not necessarily targeting an evolving market such as telecommunication and aiming more for long term reliability.

An older process was targeted and used, Tower 's180 nm CMOS, with a $f_T$/fmax (fmax is the frequency at which the power gain is unity) of 59/65 GHz to realize an RF power amplifier building block maximizing cost-to-performance and performance-to-reliability ratios. Several power amplifiers were previously realized [3-5] with state-of-the-art results (saturated power, PAE, compactness) in 180 nm at K-band. However, in most radar applications, deep saturation is avoided due to Amplitude Modulation (AM)-to-Phase Modulation (PM) distortion (AM-to-PM conversion measures the amount of undesired phase deviation that is caused by amplitude variations of the system) and difficulty to supply such input power from drivers to numerous channels, especially at high temperature.

A substantial problem occurs when the AM-PM slope (which represents the sensitivity of phase variation to amplitude variations) is high, thereby causing the accumulated effects of the process, assembly, voltage, temperature, and frequency variations to change the compression point to consequently change the phase. Such phase mismatch results in non-perfectly coherent superposition of the signals in free-space entails inefficient DC power consumption, increased heat and reduced performance.

FIG. 1 (prior art) is a block diagram of a standard phased-array transmitter with large number of transmitters for radar applications. When taking into account several hundreds of Tx channels and their dispersion in terms of gain, temperature, process variation, assembly, supply voltages, large variation can occur in their compression, even after calibration. This variation of compression impacts the output phase of the power amplifier if used in deep saturation and result into reduced radiated power due to non-perfectly coherent superposition of the radiated signals. As shown in FIG. 1, these dispersions are generally minimized through calibration using a phase shifter and equal phase attenuators (core chip). However, there is a limit to calibration complexity and accuracy, especially for high phase resolution systems with thousands of channels.

It is therefore an object of the present invention to provide a single stage amplifier with improved flatness over a wide frequency band.

It is another object of the present invention to provide a single stage amplifier with maximum Power Added Efficiency (PAE).

It is a further object of the present invention to provide a single stage amplifier with minimal AM-to-PM Conversion.

It is another object of the present invention to provide a single stage amplifier with reduced of the gain variation as a result of supply voltages variation.

It is another object of the present invention to provide a single stage amplifier with reduced impedances at the input and output.

It is another object of the present invention to provide a single stage amplifier with improved stability against unwanted oscillations.

It is a further object of the present invention to provide a single stage amplifier with gain equalization.

Other objects and advantages of the invention will become apparent as the description proceeds.

SUMMARY OF THE INVENTION

Method for improving the stability, gain, flatness and return loss and reducing the size of a power amplifier, comprising the following steps:
  a) providing a two-stage power amplifier in balanced cascode FET-based topology that consists of:
     a.1) a first common-source stage feeding into a first common-gate (CG) stage;
     a.2) a second common-source stage feeding into a second common-gate (CG) stage;
     a.3) an input matching network for matching the input impedance of the a two-stage power amplifier to a desired signal source impedance;
     a.4) an output matching network for matching the output impedance of the a two-stage power amplifier to a desired load;
  b) adding a first positive feedback path between the gate of the first common-source stage and the drain of the second common-gate (CG) stage and a second positive feedback path between the gate of the second common-source stage and the drain of the first common-gate (CG) stage;
c) adding a first negative feedback path between the drain of the first common-gate (CG) stage and the gate of the first common-source stage and a second negative feedback path between the drain of the second common-gate (CG) stage and the gate of the second common-source stage;
d) adding a first inter-stage matching network between the first common-source (CS) stage and the first common-gate (CG) stage; and
e) adding a second inter-stage matching network between the second common-source (CS) stage and the second common-gate (CG) stage.

Each negative feedback path may consist of an RC shunt-shunt topology.

Each inter-stage matching network may be in the form of an inductor L, introduced between each CS stage and its following CG, to further improve flatness and gain.

In one aspect, transformers are added to achieve a Balanced-Single Ended (Bal-SE) matching network to the output load impedance and a Balanced-Balanced (Bal-Bal) matching network to the input source impedance.

AM-PM variations may be limited by targeting a compression and a maximum Power Added Efficiency (PAE) at 3 dB compression.

In one aspect, the power amplifier supply voltage is reduced to be below nominal voltages, for increasing long-term reliability by preventing phenomenon of Hot Carrier Injection (HCI) or Temperature dependent Time-To-Breakdown (TTBD) at OP3 dB.

The amplifier topologies may include:
balanced-balanced topology;
SE-balanced topology;
balanced-SE topology;
any combination thereof.

The two-stage power amplifier may be implemented in balanced cascode bipolar topology such that:
a) each common-gate (CG) stage is replaced by a common-base (CB) stage;
b) each common-source (CS) stage is replaced by a common-emitter (CE) stage; a first positive feedback path is introduced between the base of the first common-emitter (CE) stage and the collector of the second common-base (CB) stage;
c) a second positive feedback path is introduced between the base of the second common-emitter stage and the collector of the first common-base (CB) stage;
d) a first negative feedback path is introduced between the collector of the first common-base (CB) stage and the base of the first common-emitter (CE) stage; and
e) a second negative feedback path between the collector of the second common-base (CB) stage and the base of the second common-emitter stage.

A power amplifier with improved stability, gain, flatness and return loss and reduced the size, which comprises:
a) a two-stage power amplifier in balanced cascode topology that consists of:
a.1) a first common-source stage feeding into a first common-gate stage;
a.2) a second common-source stage feeding into a second common-gate stage;
a.3) an input matching network for matching the input impedance of the a two-stage power amplifier to a desired signal source impedance;
a.4) an output matching network for matching the output impedance of the a two-stage power amplifier to a desired load;
b) a first positive feedback path between the gate of the first common-source stage and the drain of the second common-gate (CG) stage and a second positive feedback path between the gate of the second common-source stage and the drain of the first common-gate (CG) stage.
c) a first negative feedback path between the drain of the first common-gate (CG) stage and the gate of the first common-source stage and a second negative feedback path between the drain of the second common-gate (CG) stage and the gate of the second common-source stage;
d) a first inter-stage matching network between the first common-source (CS) stage and the first common-gate (CG) stage; and
e) a second inter-stage matching network between the second common-source (CS) stage and the second common-gate (CG) stage.

The first and second positive feedback paths may be essentially identical to each other.

The first and second negative feedback paths may be essentially identical to each other.

BRIEF DESCRIPTION OF THE DRAWINGS

The above and other characteristics and advantages of the invention will be better understood through the following illustrative and non-limitative detailed description of preferred embodiments thereof, with reference to the appended drawings, wherein.

DETAILED DESCRIPTION OF THE PRESENT INVENTION

The present invention proposes a wideband power amplifier cascode topology (the cascode is a two-stage amplifier that consists of a common-emitter stage feeding into a common-base stage in case of using bipolar transistors, or of a common-source stage feeding into a common-gate stage in case of using FETs) with stable high gain over wide frequency band with excellent flatness and return loss. Generally, the improved performance is achieved by combining positive and negative feedback paths with inter-device matching. To further limit AM-PM variation (the amount of unwanted phase modulation resulting from amplitude modulation), the proposed power amplifier targets a compression and a maximum Power Added Efficiency (PAE—a measure of the efficiency by which a device converts DC or RF input power to higher RF output) at 3 dB compression. Using the proposed topology, a single stage amplifier has been implemented with 13 dB±0.5 dB small-signal gain over 18-26 GHz. It achieves a OP3 dB of +17-19 dBm and a OP8 dB of +19-20 dBm up to 24 GHz. The power amplifier successfully achieved peak PAE close to OP3 dB while targeting a minimum AM-PM conversion slope. The power amplifier supply voltage was reduced below nominal voltages to ensure long-term reliability by preventing phenomenon of Hot Carrier Injection (HCI—phenomenon in solid-state electronic devices where an electron or a "hole" gains sufficient kinetic energy to overcome a potential barrier necessary to break an interface state) or Temperature dependent Time-To-Breakdown (TTBD) at OP3 dB.

Figure 1:
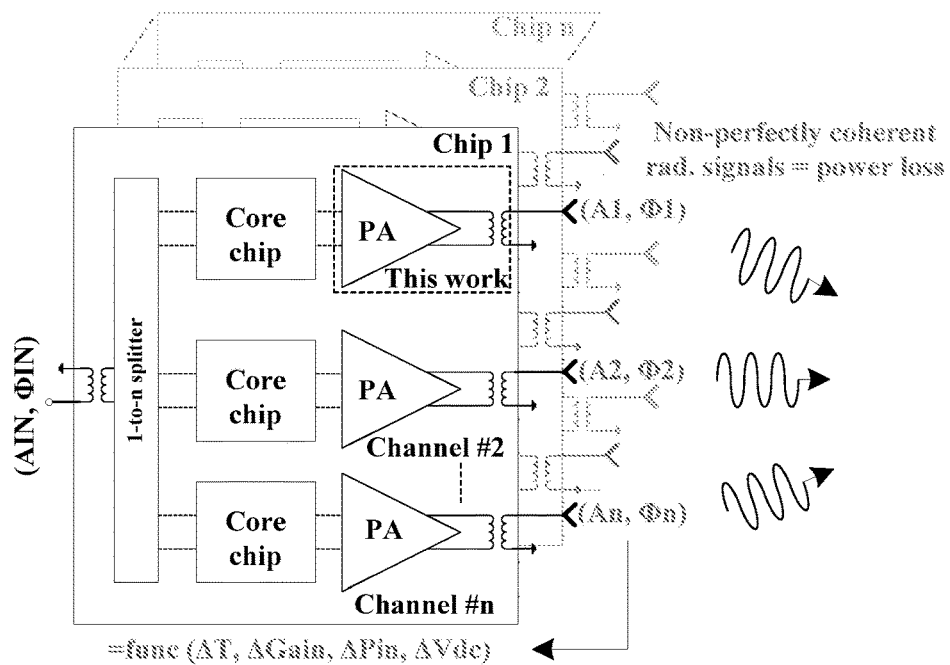
FIG. 1 illustrates a block diagram of a standard phased-array transmitter with large number of transmitters for radar applications.
Figure 2:
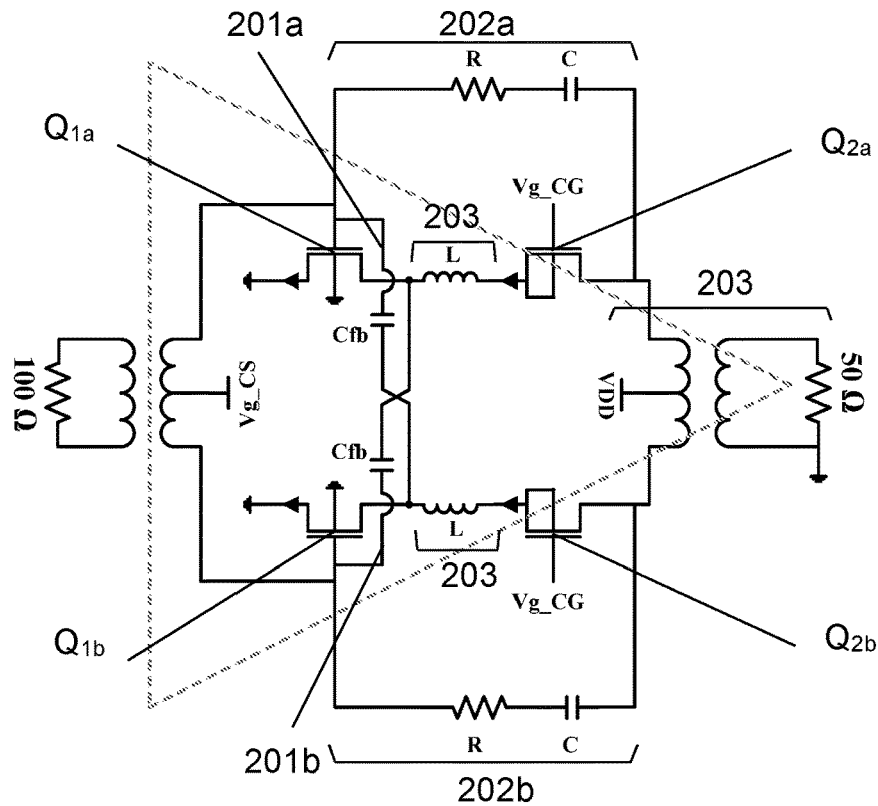
FIG. 2 shows a schematic illustration of the proposed amplifier topology, which can be used for balanced-balanced, SE-balanced and balanced-SE amplifiers.

FIG. 2. Illustrates a schematic diagram of the proposed amplifier topology (in this example, cascode FET-based topology) that is suitable for balanced-balanced, SE-balanced and balanced-SE amplifier topologies, according to an embodiment of the invention. Positive feedback paths $201a$, $201b$ and negative feedback paths $202a$, $202b$ (in this example, implementing RC shunt-shunt topology) were implemented between the common-source (CS) transistors $Q_{1a}$, $Q_{1b}$ (where in this example, $Q_{1a}$ implements is a first common-source stage and $Q_{1b}$ implements is a second common-source stage) and common-gate (CG) transistors $Q_{2a}$, $Q_{2b}$ (where in this example, $Q_{2a}$ implements is a first common-source stage and $Q_{2b}$ implements is a second common-source stage). An inter-stage matching network 203 (based on an inductor L) has also been implemented between the common-source (CS) transistors $Q_{1a}$, $Q_{1b}$ and common-gate (CG) transistors $Q_{2a}$, $Q_{2b}$, respectively.

Positive feedback paths ($201a$, $201b$) in the form of cross-coupled drain-to-gate capacitors $C_{fb}$ are widely used for common-source (CS) topologies allowing to neutralize part of the gate-drain capacitance of the transistor. However, this positive feedback is limited by stability considerations, especially when taking into account cold temperature range (below −45° C.) and "fast" process variation.

In order to maximize the effect of this positive feedback, while still keeping the transistors stable, RC shunt-shunt negative feedback paths $202a$, $202b$ are used between the drains of the common-gate transistors $Q_{2a}$, $Q_{2b}$ and the gate of the common-source transistors $Q_{1a}$, $Q_{1b}$, respectively. This negative feedback obtains the following major advantages: reduction of the gain variation due to supply voltages variation, reduced impedances at the input and output, improved stability and gain equalization (the amplifier has a wavelength-dependent gain and therefore some wavelengths are amplified more than others; gain equalization enables all wavelengths to be in approximately the same intensity).

By combining both positive and negative feedbacks, an excellent tradeoff can be reached for maximizing stability, gain, flatness and return loss. To further improve flatness and gain, an inductor L has been introduced between the CS transistor and CG transistor. Since the output impedance of the CS transistors $Q_{1a}$, $Q_{1b}$ and the input impedance of the CG transistors $Q_{2a}$, $Q_{2b}$ are both capacitive, inductor L is used to resonate them out and therefore improve the matching between both CS and CG transistors.

The introduction of the inter-stage inductor L into the cascode topology results in gain improvement that can be further traded for gain flatness and matching network by the RC shunt-shunt negative feedback paths $202a$, $202b$. The proposed topology uses simple transformers to achieve a Balanced-Single Ended (Bal-SE) output matching network (implemented by balanced-Single Ended topology) to 50Ω at the output and a Balanced-Balanced (Bal-Bal) input matching network (implemented by balanced-balanced topology) to 100Ω at the input. The proposed topology is used to achieve a single stage power amplifier with enough power gain at compression to maximize the overall PAE of the transmitter Tx. Alternatively, a transformer may be used to achieve SE-balanced topology.

Figure 3A:
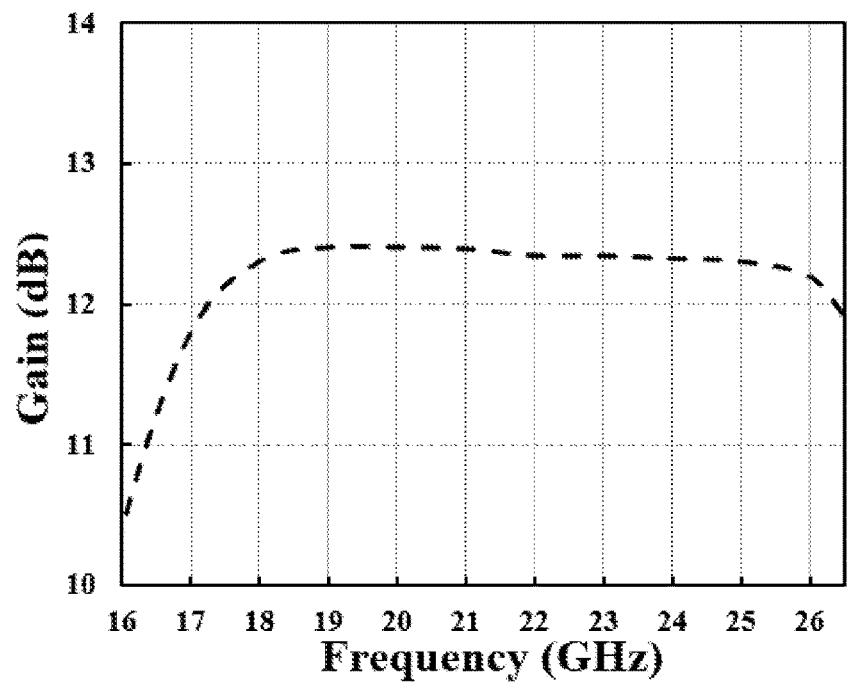
FIGS. 3A and 3B illustrate S-parameters simulation results of the proposed enhanced cascode topology realized for a single stage of amplification. The output impedance was matched for power.

FIG. 3A shows the gain flatness of the proposed power amplifier topology. It can be seen that the proposed power amplifier topology obtains excellent flatness in the range of 18-24 GHz.

Figure 3B:
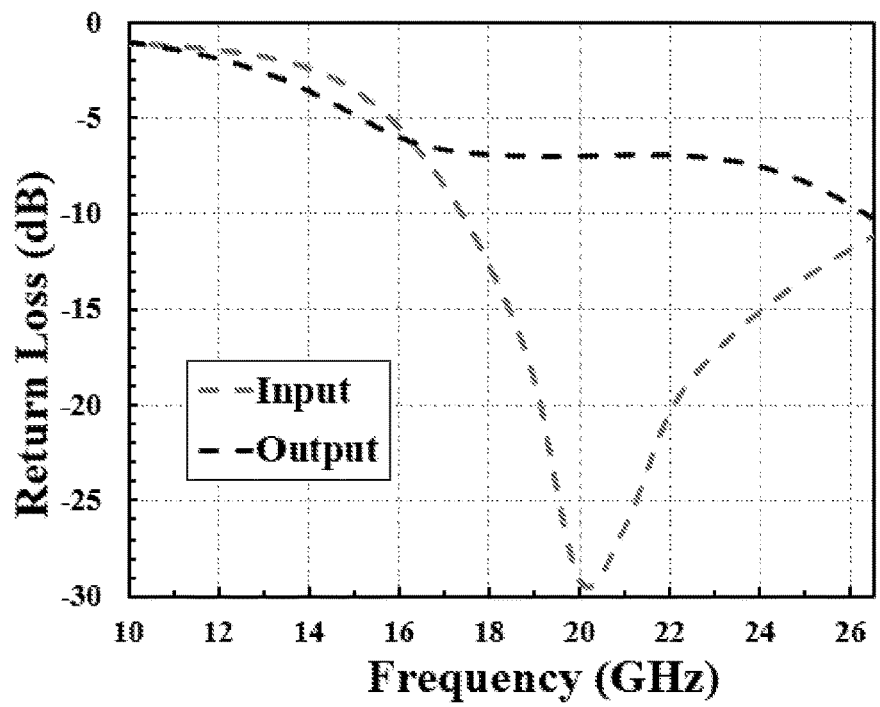

FIG. 3B shows S-parameters simulation results of the proposed enhanced cascode topology realized for a single stage of amplification. The output impedance was matched for power.

While many power amplifier demonstrates good output power and PAE at deep saturation, radar application rarely go to such degree of saturation due to increased AM-PM distortion and difficulty to supply high input power from drivers to numerous channels, especially at high temperatures. In a single transmitter, this problem is not relevant and therefore, many conventional continuous wave (CW) power amplifier do not treat it. However, when multiple radiating transmitters are required, AM-PM distortion results in power loss. In radar applications, a common practice is to look only at the AM-PM value while it is rather more important to look at its derivative. Indeed, the absolute value can generally be calibrated in each channel by using a core chip (a single monolithic circuit which is a result of integration of RF functional modules).

Figure 4A:
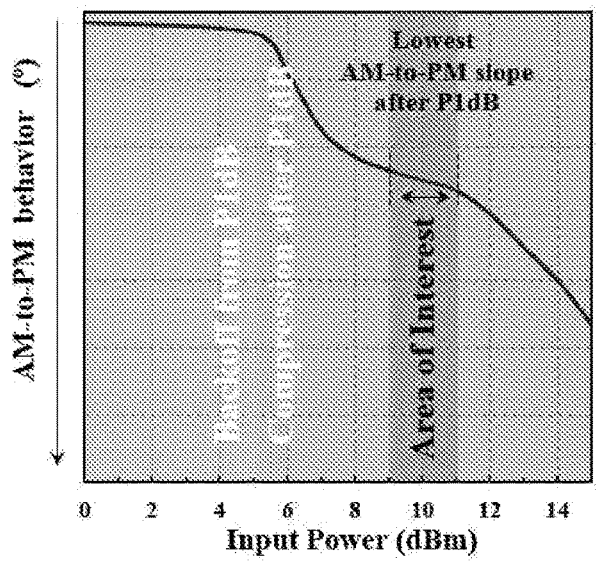
FIGS. 4A and 4B illustrate simulation results at 19 GHz of the power amplifier under large signal conditions. Maximal PAE was optimized to occur before deep saturation to maximize performance-to-reliability.
Figure 4B:
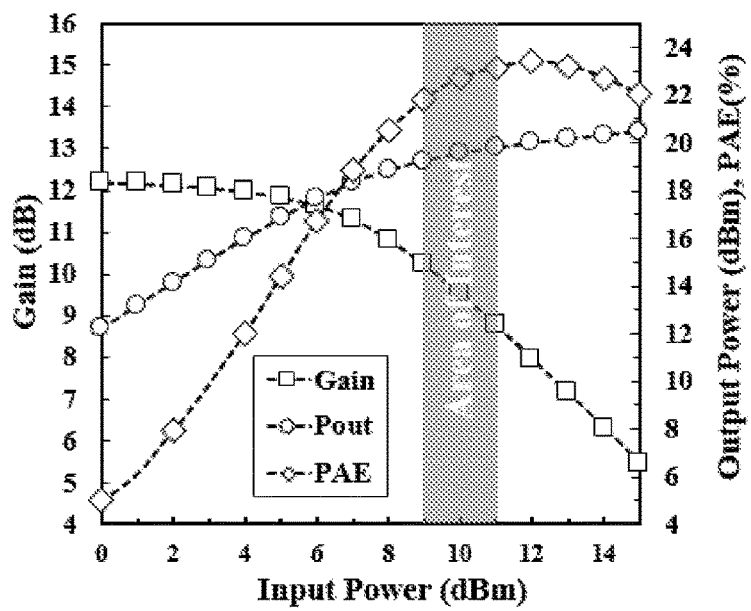

FIGS. 4A and 4B shows simulated performance of an power amplifier under large signal conditions that was designed to operate at lower compression (with the penalty of slightly reduced output power), in order to circumvent the problem of high AM-PM slope. While telecommunications combines back-off and compression during the transmitted envelop, many radar systems work almost all the time at CW into compression and therefore requires improved long term reliability. The maximum PAE was optimized to occur as close as possible to 3 dB compression point, where the AM-to-PM slope behavior is as well the most attractive, optimized by the bias point. The power amplifier has a simulated output power of +19-20 dBm around 3 dB compression with a simulated PAE of 23% at 19 GHz. At 8 dB saturation, an output power of +20.5 dBm can be achieved, with the penalty of reliability degradation.

Figure 5:
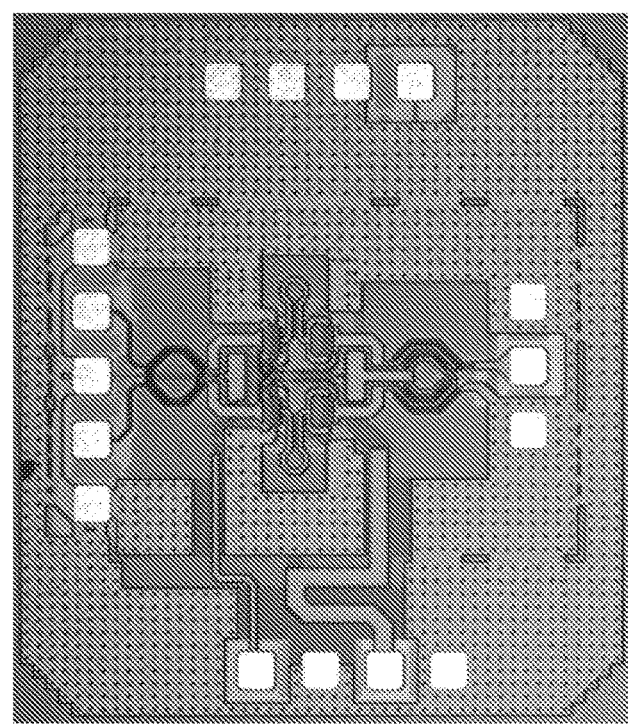
FIG. 5 illustrates chip micro-photograph of the single stage power amplifier. The chip size of the amplifier is 0.31×0.52 mm2 excluding RF and DC pads periphery.

FIG. 5 shows an IC implementation of the proposed power amplifier, fabricated using 's180 nm bulk CMOS (of Tower semiconductor) and 6 layers metal stack with a top 2μ thick metal layer in aluminum.

Figure 6A:
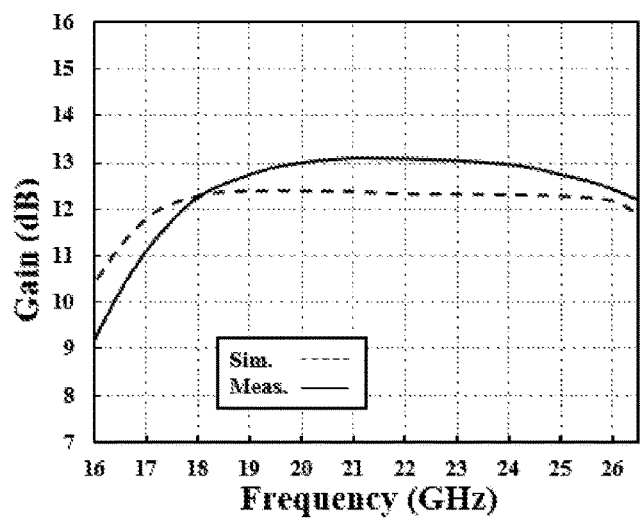
FIGS. 6 A and 6B show S-parameters measurement results of the power amplifier.
Figure 6B:
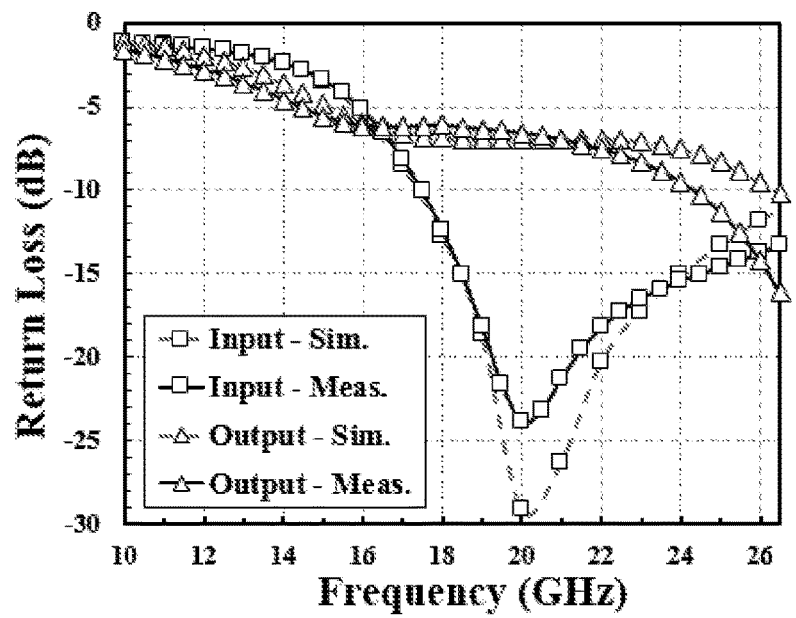

FIGS. 6A and 6B show S-parameters measurement results of the proposed power amplifier. Performance were measured on a 4 ports Vector Network Analyzer (VNA) for S-parameters and with a power meter for large signal measurement. A nominal voltage of 3.2 V was used instead of 3.6 V for improving reliability. The amplifier consumed around 105 mA. As shown in FIGS. 6A and 6B, the small signal S-parameters are very close to simulation and excellent flatness over frequency range has been achieved. The gain increase is due to the process variation of the resistance inside the RC shunt-shunt negative feedback paths 203a, 203b. Excellent correlation is observed for simulated and measured return loss.

Figure 7:
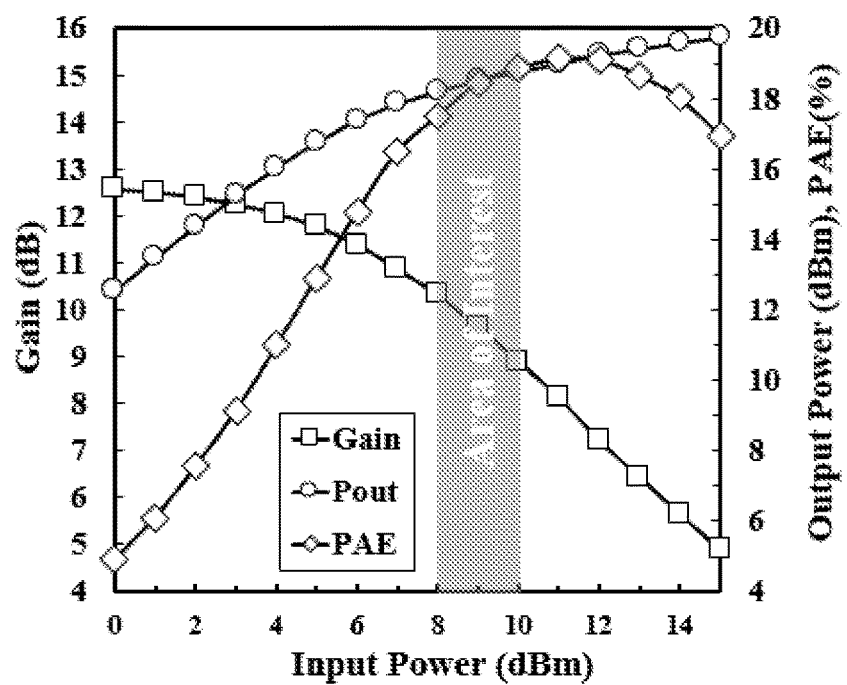
FIG. 7 shows measurement results at 19 GHz of the power amplifier under large signal conditions.
Figure 8:
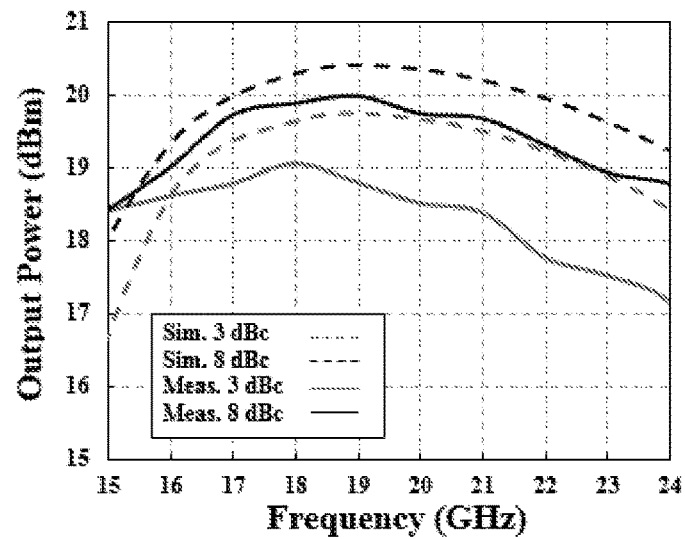
FIG. 8 shows a comparison between measured and simulated output power results at different compression of the power amplifier.
Figure 9:
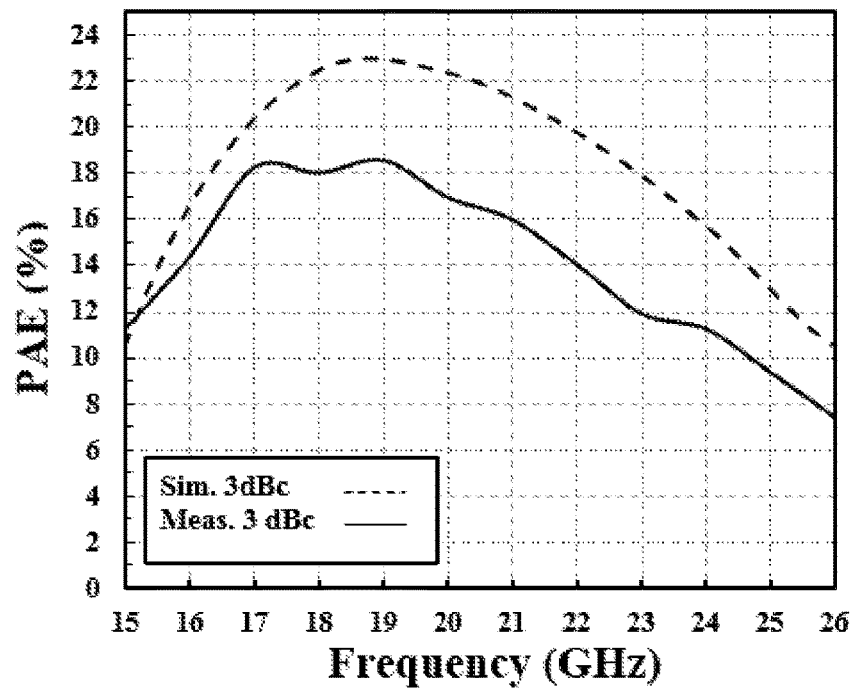
FIG. 9 shows a comparison between measured and simulated PAE results at different compression of the power amplifier.

FIGS. 7-9 show large signal measurement results. For a 3 dB compression signal, a peak PAE of 19% was measured at 19 GHz delivering an OP3 dB of +18.7 dBm.

A peak saturated power of +20 dBm was measured at 19 GHz as well. The difference between simulated and measured large signal results is due to deep-n-well model mismatch and to the dispersion of the resistance value due to process variation inside the RC feedback. As seen in FIG. 7, a 1 dB difference is observed at 3 dB compression and 0.5 dB difference at 8 dB compression over the whole K-band. FIG. 9 shows a comparison between simulated and measured PAE and output power over frequency.

The proposed power amplifier is very compact and can deliver almost +19 dBm at 3 dB compression over a core area of 0.16 mm2, which is equal to a power density of 436 mW/mm2. To further increase the power, several amplifiers could be combined to deliver larger combined power as in [2,5]. Comparison with current state-of-the-art power amplifier is shown in Table I. Since most CW power amplifiers do not consider reliability issue (different voltages, compression), it's ambiguous to compare pound-for-pound results. Even when taking into account long-term reliability and AM-PM considerations in large scale phased-array transmitters, the proposed amplifier topology demonstrates excellent output power and PAE at 3 dB compression. The proposed amplifier topology can be used repetitively and reliably to create wideband amplifiers with state-of-the-art gain, flatness and return loss over compact and small area.

By properly optimizing bias and load-pull (load pull is a technique for measuring performance parameters of an RF device and seeing how these vary with changes in matching impedance. The goal is to find the optimum operating point for an impedance match, working with the Smith chart. Further, it provides insight into the complex impedance), an output power of +18.7 dBm has been achieved with a 19% PAE at 3 dB compression only in a compact area. Additional care was taken to ensure long-term reliability.

TABLE I

Table of Comparison with the state-of-the-art Power Amplifier in CMOS at K-band

| Ref | [2] | [3] | [4] | [5] | This work |
|---|---|---|---|---|---|
| Tech. | TSMC CMOS 90 nm | TSMC CMOS 180 nm | TSMC CMOS 180 nm | TSMC CMOS 180 nm | Tower CMOS 180 nm |
| frequency (GHz) | 24 | 26 | 24 | 24 | 19 |
| SS - Gain (dB) | 14 | 15 | 8 | 15 | 13 |
| Pout (dBm) | | | | | |
| at 1 dBc | 21.7 | 16 | 20 | 17 | 17 |
| at 3 dBc | 23.5 | 18.5 | 22 | 22 | 18.7 |
| at Psat | 24.4 | 19.5 | — | 23.5 | 20 |
| PAE (%) | | | | | |
| at 1 dBc | 18 | 4 | 13 | 1 | 13 |
| at 3 dBc | 27 | 8.5 | 20 | 8 | 19 |
| at Psat | 28 | 10 | — | 11 | 17 |
| Topology | Diff. 1 Stage | Diff. 2 stages | SE. 1 stage | Diff. 2 stages | Diff. 1 stage |

TABLE I-continued

Table of Comparison with the state-of-the-art Power Amplifier in CMOS at K-band

| Ref | [2] | [3] | [4] | [5] | This work |
|---|---|---|---|---|---|
| Voltage (V) | 2 way 2.4 | 1 way 3.6 | 4 ways 3.6 | 2 ways 3.6 | 1 way 3.2 |
| Reliability consideration | — | — | — | — | Yes |
| Size (mm²) | 0.526 | 0.86 | 0.42 | 0.51 | 0.16 (*) |
| Power density (mW/mm²) | 523 at Psat | 104 at Psat | 377 at 3 dBc | 438 at Psat | 463 at 3 dBc |

(*) excluding RF and DC pads periphery.

Even though the above description has been directed to a two stage Field Effect Transistor (FET)-based power amplifier (a FET is a three-terminals type of transistor which uses an electric field to control the flow of current. FETs control the flow of current by the application of a voltage to the gate, which in turn alters the conductivity between the drain and source), the invention may also be useful when the two-stage power amplifier is implemented in balanced cascode bipolar topology. In this case, each common-gate (CG) stage is replaced by a common-base (CB) stage; each common-source (CS) stage is replaced by a common-emitter (CE) stage; a first positive feedback path is introduced between the base of the first common-emitter (CE) stage and the collector of the second common-base (CB) stage; a second positive feedback path is introduced between the base of the second common-emitter stage and the collector of the first common-base (CB) stage; a first negative feedback path is introduced between the collector of the first common-base (CB) stage and the base of the first common-emitter (CE) stage; a second negative feedback path between the collector of the second common-base (CB) stage and the base of the second common-emitter stage.

The above examples and description have of course been provided only for the purpose of illustrations, and are not intended to limit the invention in any way. As will be appreciated by the skilled person, the invention can be carried out in a great variety of ways, employing more than one technique from those described above, including the internet, a cellular network or any other wireless data network, all without exceeding the scope of the invention.

REFERENCES

[1] M. Khazraee, L. Zhang, L. Vega, M. B. Taylor, "Moonwalk: NRE Optimization in ASIC Clouds, or accelerators will use old silicon", Asplos 2017.

[2] J.-L. Lin Y.-H. Lin Y.-H. Hsiao H. Wang "A K-band transformer based power amplifier with 24.4-dBm output power and 28% PAE in 90-nm CMOS technology" IEEE MTT-S Int. Microw. Symp. Dig. pp. 31-34 June 2017.

[3] C. W. Kuo et al. "An 18 to 33 GHz Fully-Integrated Darlington Power Amplifier with Guanella-Type Transmission-Line Transformers in 0.18 ?m CMOS Technology" IEEE Microwave and Wireless Components Letters vol. 23 no. 12 pp. 668-670 December 2013.

[4] P.-C. Huang J.-L. Kuo Z.-M. Tsai K.-Y. Lin H. Wang "A 22-dBm 24-GHz power amplifier using 0.18-m. CMOS technology" Proc. IEEE MTT-S Int. Microw. Symp. Dig. pp. 248-251 May 2010.

[5] 5. C.-C. Kuo et al. "A K-band compact fully integrated transformer power amplifier in 0.18-μm CMOS" APMC. Dig. pp. 597-599 November 2013.

The invention claimed is:

1. A method for improving the stability, gain, flatness and return loss and reducing the size of a power amplifier, comprising:
   a) providing a two-stage power amplifier in balanced cascode FET-based topology that consists of:
      a.1) a first common-source stage feeding into a first common-gate (CG) stage;
      a.2) a second common-source stage feeding into a second common-gate (CG) stage;
      a.3) an input matching network for matching the input impedance of said a two-stage power amplifier to a desired signal source impedance;
      a.4) an output matching network for matching the output impedance of said a two-stage power amplifier to a desired load;
   b) adding a first positive feedback path between the gate of the first common-source stage and the drain of the second common-gate (CG) stage and a second positive feedback path between the gate of the second common-source stage and the drain of the first common-gate (CG) stage;
   c) adding a first negative feedback path between the drain of the first common-gate (CG) stage and the gate of the first common-source stage and a second negative feedback path between the drain of the second common-gate (CG) stage and the gate of the second common-source stage;
   d) adding a first inter-stage matching network between the first common-source (CS) stage and the first common-gate (CG) stage; and
   e) adding a second inter-stage matching network between the second common-source (CS) stage and the second common-gate (CG) stage.

2. A method according to claim 1, wherein each negative feedback path consists of an RC shunt-shunt topology.

3. A method according to claim 1, wherein each inter-stage matching network is in the form of an inductor L, introduced between each CS stage and its following CG, to further improve flatness and gain.

4. A method according to claim 1, further comprising adding transformers to achieve a Balanced-Single Ended (Bal-SE) matching network to the output load impedance and a Balanced-Balanced (Bal-Bal) matching network to the input source impedance.

5. A method according to claim 1, wherein AM-PM variations are limited by targeting a compression and a maximum Power Added Efficiency (PAE) at 3 dB compression.

6. A method according to claim 1, further comprising reducing the power amplifier supply voltage below nominal voltages, for increasing long-term reliability by preventing phenomenon of Hot Carrier Injection (HCI) or Temperature dependent Time-To-Breakdown (TTBD) at OP3 dB.

7. A method according to claim 1, wherein the amplifier topologies are selected from the group of:
   balanced-balanced topology;
   SE-balanced topology;
   balanced-SE topology;
   any combination thereof.

8. A method according to claim 1, wherein the two-stage power amplifier is implemented in balanced cascode bipolar topology, such that:
   a) each common-gate (CG) stage is replaced by a common-base (CB) stage;
   b) each common-source (CS) stage is replaced by a common-emitter (CE) stage; a first positive feedback path is introduced between the base of the first common-emitter (CE) stage and the collector of the second common-base (CB) stage;
   c) a second positive feedback path is introduced between the base of the second common-emitter stage and the collector of the first common-base (CB) stage;
   d) a first negative feedback path is introduced between the collector of the first common-base (CB) stage and the base of the first common-emitter (CE) stage; and
   e) a second negative feedback path between the collector of the second common-base (CB) stage and the base of the second common-emitter stage.

9. A power amplifier with improved stability, gain, flatness and return loss and reduced the size, comprising:
   a) a two-stage power amplifier in balanced cascode topology that consists of:
      a.1) a first common-source stage feeding into a first common-gate stage;
      a.2) a second common-source stage feeding into a second common-gate stage;
      a.3) an input matching network for matching the input impedance of said a two-stage power amplifier to a desired signal source impedance;
      a.4) an output matching network for matching the output impedance of said a two-stage power amplifier to a desired load;
   b) a first positive feedback path between the gate of the first common-source stage and the drain of the second common-gate (CG) stage and a second positive feedback path between the gate of the second common-source stage and the drain of the first common-gate (CG) stage;
   c) a first negative feedback path between the drain of the first common-gate (CG) stage and the gate of the first common-source stage and a second negative feedback path between the drain of the second common-gate (CG) stage and the gate of the second common-source stage;
   d) a first inter-stage matching network between the first common-source (CS) stage and the first common-gate (CG) stage; and
   e) a second inter-stage matching network between the second common-source (CS) stage and the second common-gate (CG) stage.

10. A power amplifier according to claim 8, in which each negative feedback path consists of an RC shunt-shunt topology.

11. A power amplifier according to claim 8, in which each inter-stage matching network is in the form of an inductor L, introduced between each CS stage and its following CG, to further improve flatness and gain.

12. A power amplifier according to claim 8, further comprising transformers to achieve a Balanced-Single Ended (Bal-SE) matching network to the output load impedance and a Balanced-Balanced (Bal-Bal) matching network to the input source impedance.

13. A power amplifier according to claim 8, in which AM-PM variations are limited by targeting a compression and a maximum Power Added Efficiency (PAE) at 3 dB compression.

14. A power amplifier according to claim 8, in which reduced the supply voltage is reduced to be below nominal voltages, for increasing long-term reliability by preventing phenomenon of Hot Carrier Injection (HCI) or Temperature dependent Time-To-Breakdown (TTBD) at OP3 dB.

15. A power amplifier according to claim 8, in which the first and second positive feedback paths are essentially identical to each other.

16. A power amplifier according to claim 8, in which the first and second negative feedback paths are essentially identical to each other.

\* \* \* \* \*